United States Patent
Ding et al.

(10) Patent No.: US 10,979,005 B2
(45) Date of Patent: Apr. 13, 2021

(54) CURRENT AMPLIFICATION CIRCUITRY AND DRIVING METHOD THEREOF, AND FINGERPRINT DETECTION DEVICE

(71) Applicant: BOE TECHNOLOGY GROUP CO., LTD., Beijing (CN)

(72) Inventors: Xiaoliang Ding, Beijing (CN); Haisheng Wang, Beijing (CN); Yingming Liu, Beijing (CN); Xueyou Cao, Beijing (CN); Ping Zhang, Beijing (CN); Yanling Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 16/332,246

(22) PCT Filed: May 31, 2018

(86) PCT No.: PCT/CN2018/089235
§ 371 (c)(1),
(2) Date: Mar. 11, 2019

(87) PCT Pub. No.: WO2019/007168
PCT Pub. Date: Jan. 10, 2019

(65) Prior Publication Data
US 2019/0238103 A1 Aug. 1, 2019
US 2020/0259469 A9 Aug. 13, 2020

(30) Foreign Application Priority Data
Jul. 3, 2017 (CN) .......................... 201710533994.7

(51) Int. Cl.
*H03F 3/08* (2006.01)
*G06K 9/00* (2006.01)

(52) U.S. Cl.
CPC ............ *H03F 3/082* (2013.01); *G06K 9/0002* (2013.01); *G06K 9/0004* (2013.01); *H03F 2200/129* (2013.01); *H03F 2200/228* (2013.01)

(58) Field of Classification Search
CPC ............... H03F 3/082; H03F 2200/129; H03F 2200/228; G06K 9/00013; G06K 9/0004
(Continued)

(56) References Cited

U.S. PATENT DOCUMENTS 5,693,934 A * 12/1997 Hohmoto ............. H03K 17/795
250/214 A
5,990,671 A * 11/1999 Nagata .................... G05F 3/262
323/313
(Continued)

FOREIGN PATENT DOCUMENTS

CN 102480275 A 5/2012
CN 102646388 A 8/2012
(Continued)

OTHER PUBLICATIONS

PCT International Search Report, Application No. PCT/CN2018/089235, dated Aug. 16, 2018, 5 pages: with English translation.
(Continued)

*Primary Examiner* — Kevin K Pyo
(74) *Attorney, Agent, or Firm* — Armstrong Teasdale LLP

(57) ABSTRACT

Embodiments of the present disclosure provide a current amplification circuitry and a driving method thereof, and a fingerprint detection device. The current amplification circuitry includes a voltage control circuit, a plurality of first current amplification circuits, and a second current amplification circuit. The voltage control circuit provides a voltage control signal to the plurality of first current amplification circuits. The first current amplification circuit includes a current mirror, and the current mirror is coupled to a (Continued)

voltage input terminal, the voltage control circuit, and a first input terminal of the second current amplification circuit. The first current amplification circuit amplifies a current from the voltage input terminal according to the voltage control signal provided by the voltage control circuit, and provides the amplified current to the second current amplification circuit. The second current amplification circuit is coupled to the voltage input terminal via a second input terminal and amplifies the amplified current.

14 Claims, 4 Drawing Sheets

(58) Field of Classification Search
USPC ...................................... 250/214 A
See application file for complete search history.

(56) References Cited

U.S. PATENT DOCUMENTS

2006/0262055 A1 11/2006 Takahara
2008/0309407 A1* 12/2008 Nakamura .............. H03F 3/087
330/253

FOREIGN PATENT DOCUMENTS

| CN | 104915657 A | 9/2015 |
| CN | 107330409 A | 11/2017 |
| JP | 2000213908 A | 8/2000 |

OTHER PUBLICATIONS

PCT Written Opinion, Application No. PCT/CN2018/089235, dated Aug. 16, 2018, 5 pages.: with English translation of relevant part.
China First Office Action, Application No. 201710533994.7, dated Jun. 12, 2019, 19 pps.: with English translation.

* cited by examiner

CURRENT AMPLIFICATION CIRCUITRY AND DRIVING METHOD THEREOF, AND FINGERPRINT DETECTION DEVICE

CROSS REFERENCE TO RELATED APPLICATIONS

This patent application is a National Stage Entry of PCT/CN2018/089235 filed on May 31, 2018, which claims the benefit and priority of Chinese Patent Application No. 201710533994.7 filed on Jul. 3, 2017, the disclosures of which are incorporated by reference herein in their entirety as part of the present application.

BACKGROUND

The present disclosure relates to the field of display technologies, and particularly, to a current amplification circuitry and a driving method thereof, and a fingerprint detection device.

With rapid development of science and technology, mobile products with biometric functions are wildly used in people's life and work. Because human fingerprint is unique, fingerprint recognition technology has received much attention and research. At present, sliding-type fingerprint recognition technology and pressing-type fingerprint recognition technology based on silicon-based processes have been implemented in mobile products. Corresponding terminal functions may be performed by performing fingerprint recognition in non-display areas of mobile terminals. For example, a screen unlocking function can be performed through fingerprint recognition. The core of people's attention in the future is to apply fingerprint recognition technology on display areas of mobile terminals.

BRIEF DESCRIPTION

Embodiments of the present disclosure provide a current amplification circuitry and a driving method thereof, and a fingerprint detection device.

A first aspect of the present disclosure provides a current amplification circuitry. The current amplification circuitry includes a voltage control circuit, a plurality of first current amplification circuits, and a second current amplification circuit. The voltage control circuit is coupled to the plurality of first current amplification circuits and configured to provide a voltage control signal to the plurality of first current amplification circuits. The first current amplification circuit includes a current mirror. The current mirror is coupled to a voltage input terminal, the voltage control circuit, and a first input terminal of the second current amplification circuit, respectively. The current amplification circuitry can be configured to amplify a current from the voltage input terminal according to the voltage control signal provided by the voltage control circuit and provide the amplified current to the second current amplification circuit. The second current amplification circuit is coupled to the voltage input terminal via a second input terminal and configured to amplify the amplified current.

In an embodiment of the present disclosure, the current mirror includes a first transistor and a second transistor. A control electrode and a first electrode of the first transistor are coupled to the voltage input terminal, and a second electrode of the first transistor is coupled to the voltage control circuit. A control electrode of the second transistor is coupled to the control electrode of the first transistor, a first electrode of the second transistor is coupled to the second electrode of the first transistor, and a second electrode of the second transistor is coupled to the first input terminal of the second current amplification circuit.

In an embodiment of the present disclosure, the amplification factor of the current mirror for amplifying the current from the voltage input terminal is inversely proportional to a width to length ratio of the first transistor, and is proportional to a width to length ratio of the second transistor.

In an embodiment of the present disclosure, the voltage input terminal provides a high level voltage signal. The voltage control circuit provides voltage control signals in time sequence to the plurality of first current amplification circuits respectively. At time T, a low level voltage signal is provided to one of the first current amplification circuits, and a high level voltage signal is provided to the other first current amplification circuits.

In an embodiment of the present disclosure, the first current amplification circuit further includes a photodiode coupled between the voltage input terminal and the current mirror. The current mirror amplifies a photocurrent provided by the photodiode.

In an embodiment of the present disclosure, the current amplification circuitry further includes a feedback resistor. One end of the feedback resistor is coupled to an output terminal of the second current amplification circuit, and the other end of the feedback resistor is coupled to the first input terminal of the second current amplification circuit.

In an embodiment of the present disclosure, the current amplification circuitry further includes an analog to digital converter. The analog to digital converter is coupled to the output terminal of the second current amplification circuit.

In an embodiment of the present disclosure, the voltage control circuit, the second current amplification circuit, and the voltage input terminal are integrated in an integrated circuit chip.

In an embodiment of the present disclosure, the first current amplification circuits are formed in pixel units of an array substrate and correspond to the pixel units respectively.

In an embodiment of the present disclosure, a coupling line between the second electrode of the first transistor and the voltage control circuit is provided in the same layer as the first electrode and the second electrode of the pixel unit by a patterning process. A coupling line between the second electrode of the second transistor and the voltage control circuit is provided in the same layer as the first electrode and the second electrode of the pixel unit by a patterning process. A coupling line between the second electrode of the second transistor and the second current amplification circuit is provided in the same layer as the first electrode and the second electrode of the pixel unit by a patterning process. A coupling line between the second electrode of the first transistor and the first electrode of the second transistor is provided in the same layer as the control electrode of the pixel unit by a patterning process. A coupling line between the control electrode of the first transistor and the control electrode of the second transistor is provided in the same layer as the control electrode of the pixel unit by a patterning process. A coupling line between the first electrode of the first transistor and the control electrode of the second transistor is provided in the same layer as the control electrode of the pixel unit by a patterning process. The current amplification circuitry further includes a photodiode coupled between the voltage input terminal and the current mirror. A coupling line between one end of the photodiode and the first electrode of the first transistor is provided in the same layer as the control electrode of the pixel electrode by a patterning process, and the other end of the photodiode is coupled to the voltage input terminal through a common electrode of the pixel unit.

A second aspect of the present disclosure provides a method for driving a current amplification circuitry according to the first aspect of the present disclosure. In the method, a high level voltage signal is provided to a plurality of first current amplification circuits and a second current amplification circuit by a voltage input terminal. A voltage control signal is provided to the plurality of first current amplification circuits by the voltage control circuit to control the plurality of first current amplification circuits to amplify the current from the voltage input terminal respectively. The amplified current is amplified by the second current amplification circuit.

In an embodiment of the present disclosure, providing, by the voltage control circuit, the voltage control signal to the plurality of first current amplification circuits to control the plurality of first current amplification circuits to amplify the current from the voltage input terminal, includes providing, by the voltage control circuit, voltage control signals in time sequence to the plurality of first current amplification circuits, such that a low level voltage signal is provided to one of the first current amplification circuits and a high level voltage signal is provided to the other first current amplification circuits at time T.

In an embodiment of the present disclosure, the first current amplification circuit further includes a photodiode coupled between the voltage input terminal and the current mirror. Amplifying the current from the voltage input terminal by the first current amplification circuit includes amplifying, by the first current amplification circuit, the photocurrent provided from the photodiode.

A third aspect of the present disclosure provides a fingerprint detection device including a current amplification circuitry according to the first aspect of the present disclosure.

DETAILED DESCRIPTION

In order to make the above features and advantages of the present disclosure more obvious and understandable, the present disclosure is further described in detail in connection with the drawings and specific embodiments.

In the description of the present disclosure, "a plurality" means two or more, unless otherwise stated. The terms "upper", "lower", "left", "right", "inside", "outside" and the like indicate orientations or positional relationships based on the drawings, and are merely intended to conveniently describe the embodiments of the present disclosure and simplify the description, without suggesting or implying that the machine or component referred to has a specific orientation, or is constructed and operated in a specific orientation. Therefore, it is not to be construed as limiting the disclosure.

In the description of the present disclosure, it is to be noted that the terms "mounted", "connected", and "coupled" are to be understood broadly, unless specifically stated and defined otherwise, and for example, may refer to being fixedly coupled, or removably coupled, or integrally coupled, may refer to being mechanically coupled or just coupled, and may refer to being directly connected or indirectly connected through an intermediate medium. Specific meanings of the above terms in the present disclosure may be understood in specific circumstances by those skilled in the art.

Figure 1:
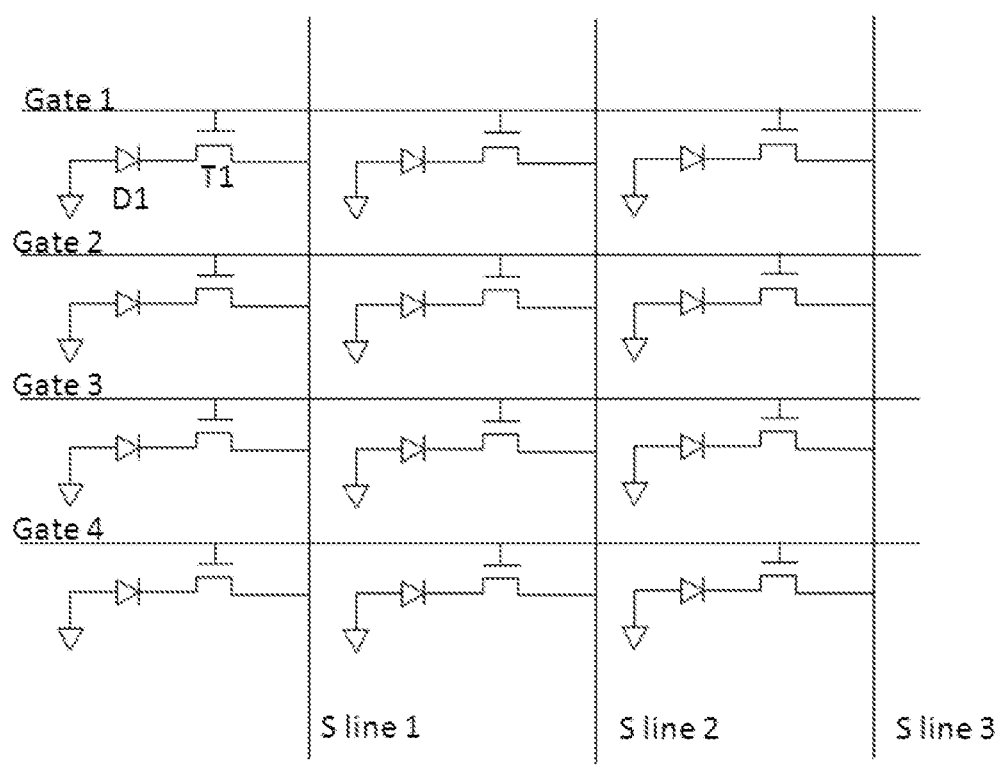
FIG. 1 exemplarily shows a schematic diagram of a fingerprint recognition sensor.

Generally, a fingerprint recognition device includes a fingerprint recognition sensor, an integrated circuit (IC), and a current calculator. FIG. 1 exemplarily shows a schematic diagram of a fingerprint recognition sensor. As shown in FIG. 1, the fingerprint recognition sensor includes a plurality of sensors arranged in an array. Each sensor is composed of a photodiode and a thin film transistor. In a case that fingerprint scanning is performed with the fingerprint recognition sensor, due to different structure of ridges and valleys of a fingerprint, different reflections may be generated when a light source illuminates a finger, and therefore intensity of light reaching the photodiode may be different. As the intensities of lights received by the plurality of photodiodes are different, the plurality of photodiodes may generate currents with different intensities. The IC can be configured to amplify the currents provided from the different photodiodes of the fingerprint recognition sensor and perform digital-to-analog conversion processing. The current calculator can be configured to calculate the current difference between the currents provided from the IC, and identify fingerprint information based on the calculated current difference.

As the photocurrent generated by the photodiode is usually small, a large resistance resistor is generally needed to be placed in the IC to amplify the photocurrent, such that a current can be obtained as required. However, the large resistance resistor may cause device accuracy problems and is difficult to be integrated into the IC.

Specific implementation manners of the present disclosure are further described in detail below in conjunction with the accompanying drawings and embodiments. The following examples are intended to illustrate the present disclosure, but in no way to limit the scope of the present disclosure.

Embodiments of the present disclosure provide a current amplification circuit. The current amplification circuit includes a voltage control circuit, a plurality of first current amplification circuits, and a second current amplification circuit. The first current amplification circuit can include a current mirror. The current mirror can be configured to perform a first stage of amplification processing on the current from the voltage input terminal. The second current amplification circuit can be configured to perform a second stage of amplification processing on the current. The requirements for amplification factor of the second current amplification circuit can be reduced by providing the current mirror. The resistance magnitude of the resistor to be provided in the second current amplification circuit can be reduced. Therefore, it can facilitate resistor integration and improve device precision.

Figure 2:
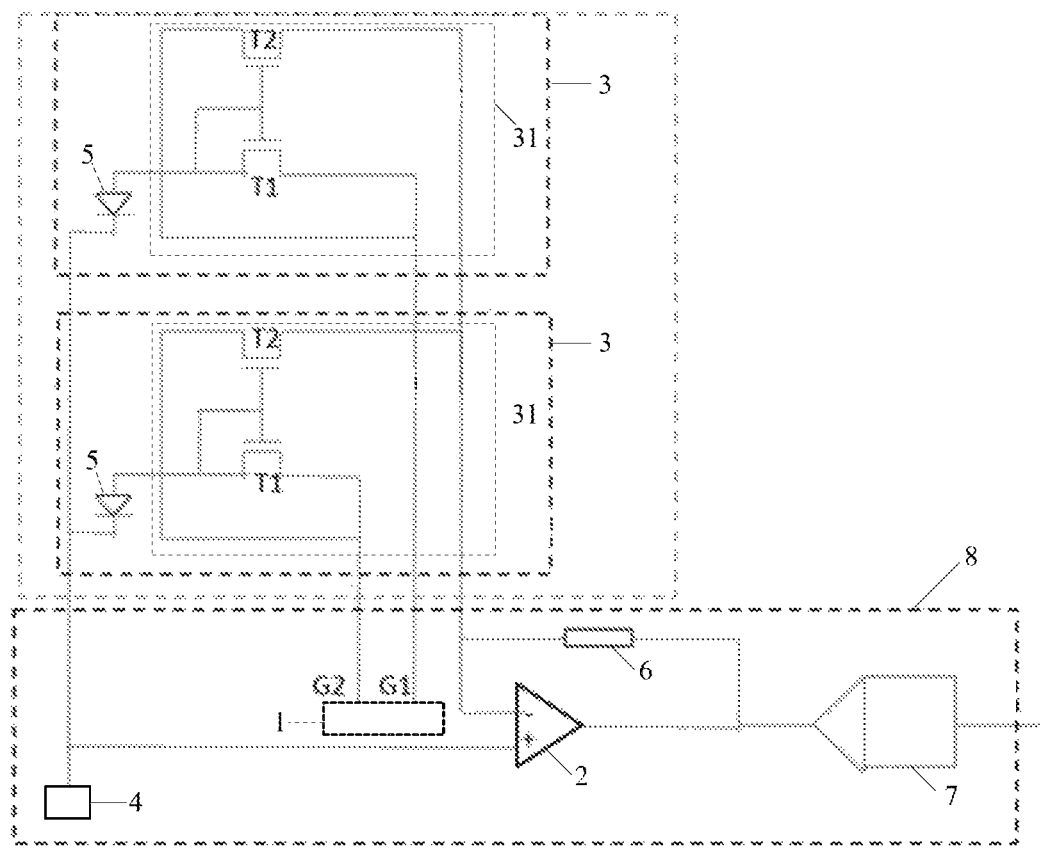
FIG. 2 is a schematic diagram of a current amplification circuitry according to an embodiment of the present disclosure.

FIG. 2 is a schematic structural diagram of a current amplification circuitry according to an embodiment of the present disclosure. The current amplification may amplify an inflow current. As shown in FIG. 2, the current amplification circuitry includes a voltage control circuit 1, a second current amplification circuit 2, and a plurality of first current amplification circuits 3. The plurality of first current amplification circuits 3 may be arranged, for example, in an array. Though only two first current amplification circuits 3 are shown in FIG. 2, number of first current amplification circuits 3 may be configured according to actual conditions.

Figure 3:
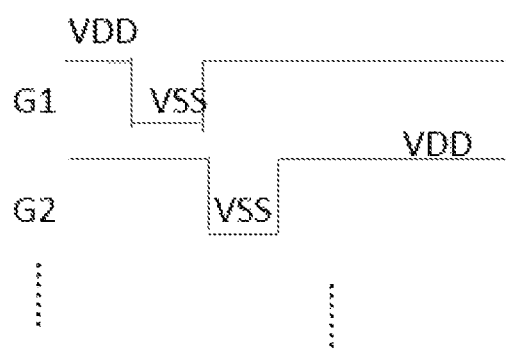
FIG. 3 is a timing diagram of voltage control signals provided from a voltage control circuit in the current amplification circuitry according to an embodiment of the present disclosure.

The voltage control circuit 1 can be coupled to the first current amplification circuit and may be configured to provide a voltage control signal to the first current amplification circuit 3. In the embodiment of the present disclosure, the voltage control signal is a voltage signal, such as voltage signals G1, G2 as shown in FIG. 3, which will be described in detail hereinafter. Accordingly, the voltage control circuit 1 may be a signal generator, which may be implemented by an integrated circuit. Furthermore, the voltage control circuit 1 may also be implemented in the form of a processor and a memory storing program instructions, wherein the processor is capable of executing the program instructions to provide a voltage control signal.

The first current amplification circuit 3 may include a current mirror 31. The current mirror 31 can be coupled to a voltage input terminal 4, the voltage control circuit 1, and a first input terminal (e.g., an inverting input terminal) of the second current amplification circuit 2, respectively. The first current amplification circuit 3 may be configured to amplify a current from the voltage input terminal 4 according to the voltage control signal provided by the voltage control circuit 1, and provide the amplified current to the second current amplification circuit 2. In some embodiments, the current mirror 31 in each of the first current amplification circuits 3 receives the voltage control signal from the voltage control circuit 1, such that the current provided from the voltage input terminal 4 can be amplified.

The second current amplification circuit 2 can be coupled to the voltage input terminal 4 via a second input terminal (e.g., a non-inverting input terminal) and may be configured to amplify the amplified current.

In some embodiments, the voltage input terminal 4 is coupled to an end of the current mirror 31 to provide a voltage. The voltage control circuit 1 is coupled to the other end of the current mirror 31 to provide the voltage control signal. The above two voltages may control a transistor in the current mirror 31 to be turned on or turned off, thereby controlling the current mirror 31 to perform the amplification process on the current from the voltage input terminal 4. In this way, the current amplification process can be implemented by the current amplification circuitry.

The current from the voltage input terminal 4 can be amplified by the current mirror 31 and then flows into the second current amplification circuit 2. The second current amplification circuit 2 performs a second amplification processing on the current to obtain a current with a desired magnitude. By providing the current mirror 31, the requirements on the amplification factor of the second current amplification circuit 2 for amplifying the current can be reduced, and the resistance magnitude of the resistor to be provided in the second current amplification circuit 2 can also be reduced. A resistor with a small resistance value can be easily integrated into an integrated circuit chip, such that high precision requirements can be satisfied for the integrated circuit chip.

In the embodiment of the present disclosure, the current mirror 31 in the first circuit amplification circuit 3 may include a first transistor T1 and a second transistor T2.

As shown in FIG. 2, a control electrode and a first electrode of the first transistor T1 are coupled to the voltage input terminal 4, and a second electrode of the first transistor T1 is coupled to the voltage control circuit. A control electrode of the second transistor T2 is coupled to the control electrode of the first transistor, a first electrode of the second transistor T2 is coupled to the second electrode of the first transistor T1, and a second electrode of the second transistor T2 is coupled to the first input terminal of the second current amplification circuit 2.

Based on the above structure, the voltage control circuit 1 provides the voltage control signal to the current mirror 31 when the voltage control circuit 1 operates. The current first flows to the second electrode of the first transistor T1. After passing through the first transistor T1, the current flows from the first electrode of the first transistor T1 to the second electrode of the second transistor T2. Then, after passing through the second transistor T2, the current flows from the second electrode of the second transistor T2 to the first input terminal of the second current amplification circuit 2. The current from the voltage input terminal 4 flows through the current mirror and then is amplified. Therefore, the first-stage of the amplification processing on the current can be implemented by the current amplification circuitry.

In an embodiment of the present disclosure, the transistor in the current mirror 31 may be an N-type transistor or a P-type transistor. Specifically, the transistor may be an N-type or P-type field effect transistor (MOSFET), or an N-type or P-type bipolar transistor (BJT). In an embodiment of the present disclosure, a gate of a transistor can be referred to as a control electrode. Since a source and a drain of a transistor are symmetrical, the source and the drain can be not distinguished, that is, the source of the transistor may be referred to as the first electrode (or the second electrode), and the drain may be referred to as the second electrode (or the first electrode).

Based on the structure of the transistor and the above structure of the current mirror 31, the amplification factor of the current mirror 31 for amplifying the current from the voltage input terminal 4 can be configured to be inversely proportional to a width to length ratio ($W_1/L_1$) of the first transistor T1, and proportional to the width to length ratio ($W_2/L_2$) of the second transistor T2. In some embodiments, current $I_{in}$ is provided to the voltage input terminal 4, and current $I_{out}$ provided from the current mirror 31 can be: $I_{out}=(W_2/L_2)/(W_1/L_1) \times I_{in}$. In practice, the amplification factor of the current mirror 31 for amplifying the current may be adjusted by adjusting the width to length ratio of the first transistor T1 and the width to length ratio of the second transistor T2, such that the purpose of amplifying the current by the current mirror 31 can be achieved.

The current amplification circuitry provided by the embodiment of the present disclosure includes a plurality of first current amplification circuits 3 arranged in an array. The voltage control circuit 1 may output the voltage control signal to the first current amplification circuit 3 to control the current mirror 31 of each of the first current amplification circuits 3 to operate.

In the embodiment of the present disclosure, the voltage control signal may control all of the plurality of first current amplification circuits 3 to perform current amplification processing at the same time, or may also control part of the plurality of first current amplification circuits 3 to operate at the same time, and control the other part of the plurality of first current amplification circuits 3 to work after the part of the plurality of first current amplification circuits 3 finishes operating, or may control the plurality of first current amplification circuits 3 to operate in sequence.

With respect to the third case described above, the voltage control circuit 1 may provide voltage control signals in time sequence to the plurality of first current amplification circuits 3 arranged in an array, respectively. At time T, a low level voltage signal is provided to one of the first current amplification circuits 3, a high level voltage signal is provided to the other first current amplification circuits 3, and a high level voltage signal is provided to the voltage input terminal. The waveform of the voltage control signal may refer to FIG. 3. In FIG. 3, G1 is a waveform diagram of a voltage control signal provided to a first current amplification circuit 3, and G2 is a waveform diagram of a voltage control signal provided to another first current amplification circuit 3. As may be seen from FIG. 3, the voltage control circuit 1 may provide a low level voltage signal to only one of the first current amplification circuits 3 at a certain time, and outputs a high level voltage signal to the other first current amplification circuits 3.

In the embodiment of the present disclosure, at time T, a high level voltage signal provided by the voltage input terminal flows into an end of a certain current mirror 31, and a low level voltage signal provided by the voltage control circuit 1 flows into the other end of the current mirror 31. There is a voltage difference between the first electrode (i.e., the control electrode) and the second electrode of the transistor in the current mirror 31. The transistor is turned on. The current mirror 31 may amplify the current from the voltage input terminal. For the other first current amplification circuits 3, the first electrode (i.e., the control electrode) and the second electrode of the transistor in the current mirror 31 are both provided with high level voltage signals. The current mirrors 31 in the other first current amplification circuits 3 are turned off. Therefore, under the control of the voltage control signal, the voltage control circuit 1 controls the plurality of first current amplification circuits 3 to sequentially work according to the voltage control signals in time sequence. Therefore, the current amplification processing can be performed in time sequence, realizing the control of the plurality of first current amplification circuits 3.

In a case where the voltage control signal from the voltage control circuit 1 is applied to the current amplification circuits shown in FIG. 2, the voltage input terminal 4 provides a high level voltage signal to the first electrode (i.e., the control electrode) of the first transistor T1, and the voltage control circuit 1 provides a low level voltage signal to the second electrode of the first transistor T1. As there is a voltage difference between the first electrode and the second electrode of the first transistor T1, the first transistor T1 is turned on. The current from the voltage input terminal 4 flows through the first transistor T1 to the first electrode of the second transistor T2. As there is also a voltage difference between the first electrode (i.e., the control electrode) and the second electrode of the second transistor T2, the second transistor T2 is turned on, and the inflow current passes through the second transistor T2 and is outputted.

In an embodiment of the present disclosure, the first current amplification circuit 3 may further include a photodiode 5 coupled between the voltage input terminal and the current mirror 31. One end (input terminal) of the photodiode 5 is coupled to the voltage input terminal, and the current mirror 31 amplifies the photocurrent from the photodiode 5. The photodiode 5 may convert the surrounding light energy into a current. As the current from the photodiode 5 is small, the photodiode 5 may be provided in the first current amplification circuit 3 according to the embodiment of the present disclosure. The current mirror 31 is configured to perform the first stage of amplification processing on the small current from the photodiode 5. The second current amplification circuit 2 is configured to perform the second stage of amplification processing on the current. In this way, a current with desired magnitude can be obtained.

In an embodiment of the present disclosure, the current amplification circuitry may further include a feedback resistor 6. An end of the feedback resistor 6 can be coupled to the output terminal of the second current amplification circuit 2, and the other end can be coupled to the first input terminal of the second current amplification circuit 2.

The feedback resistor 6 may change the voltage at the output terminal of the second current amplification circuit 2 according to the magnitude of the current flowing from the current mirror 31 to the second current amplification circuit 2. As a result, the voltage at the output terminal of the second current amplification circuit 2 changes according to the magnitude of the current from the current mirror 31. The voltage at the output terminal of the second current amplification circuit 2 is $V_{out}=V_1-R_{fb}\times I_{data}$, wherein $V_1$ is the voltage at the input terminal of the second current amplification circuit 2, $R_{fb}$ is the resistance value of the feedback resistor 6, and $I_{data}$ is the current flowing from the current mirror 31 to the second current amplification circuit 2.

In an embodiment of the present disclosure, the current amplification circuitry may further include an analog to digital conversion circuit 7 coupled to the output terminal of the second current amplification circuit 2. In an embodiment of the present disclosure, the analog to digital conversion circuit 7 may be an analog to digital converter. The analog to digital conversion circuit 7 may convert an analog signal from the second current amplification circuit 2 into a digital signal, and output a current value in a digital form for viewing.

In an embodiment of the present disclosure, the voltage control circuit 1, the second current amplification circuit 2, and the voltage input terminal 4 may be integrated in an integrated circuit chip 8 to constitute an integrated circuit. As the current amplification circuitry may further include other devices, the voltage control circuit 1, the second current amplification circuit 2, the voltage input terminal 4, the feedback resistor 6, and the analog to digital conversion circuit 7 may be integrated in the integrated circuit chip 8 to constitute an integrated circuit.

The current amplification circuitry according to the embodiment of the present disclosure can be implemented in various applications. For example, a plurality of pixel units are formed on an array substrate, and a plurality of pixel unit are arranged in an array. The first current amplification circuits 3 may be formed in pixel units of the array substrate, and the first current amplification circuits 3 correspond to the pixel units respectively.

In the embodiment in which the first current amplification circuits 3 are formed in the pixel units of the array substrate, coupling lines may be arranged for devices in the first current amplification circuits 3 in the pixel units. However, the arranged coupling lines may occupy space of the pixel units, and increase structural complexity and manufacturing difficulty of the pixel units. Moreover, testing and maintenance of the pixel units can also be inconvenient. Therefore, in the embodiment of the present disclosure, the coupling lines for the devices in the first current amplification circuits 3 and the metal layers in the pixel units can be provided in the same layer by a patterning process, such as the first electrode, the second electrode, the control electrode of the transistor, and the common electrode, etc. Therefore, the coupling lines between devices may be easily arranged, and the structure of the pixel unit can be simplified. Therefore, it facilitates manufacture, testing and maintenance of the pixel units.

Figure 4:
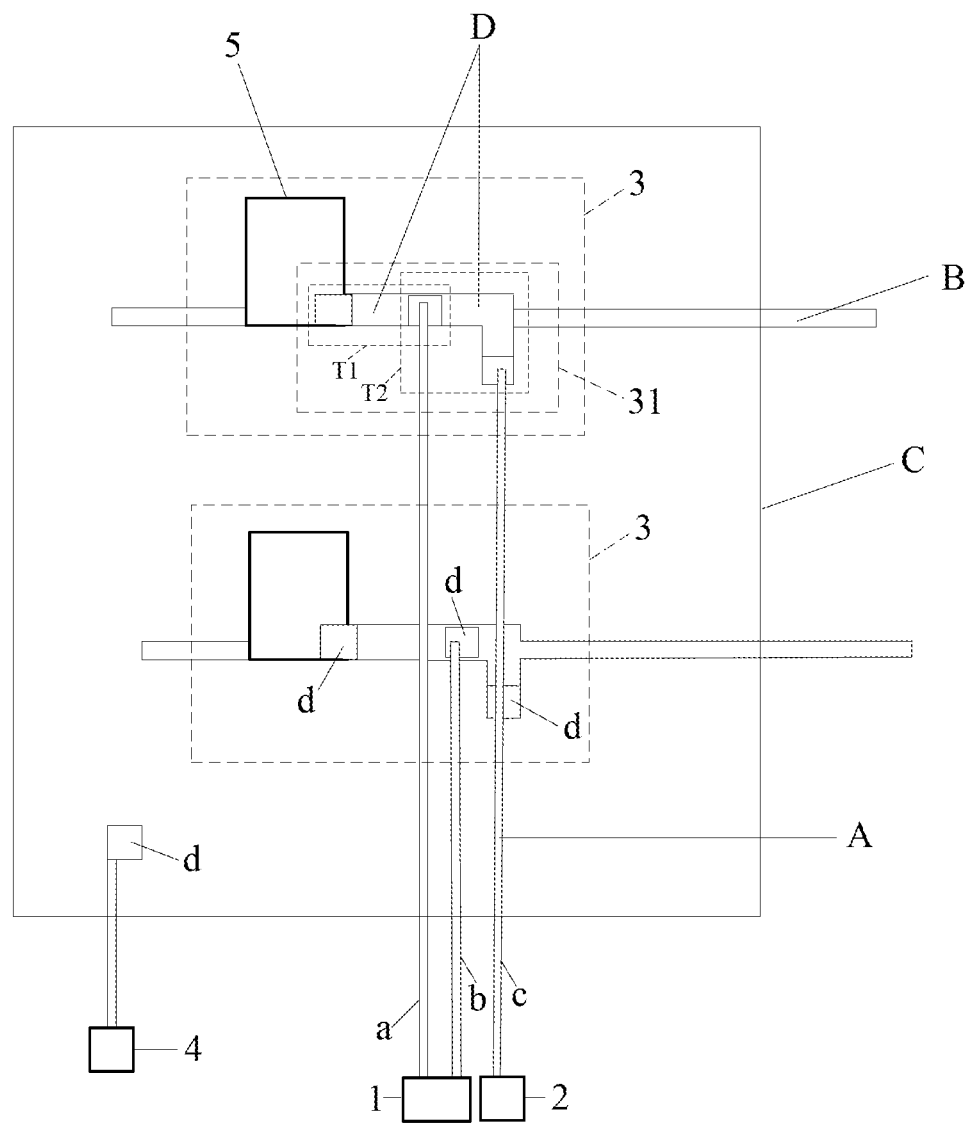
FIG. 4 is a schematic structural diagram of a first current amplification circuit formed on a pixel unit in the current amplification circuitry according to an embodiment of the present disclosure.

FIG. 4 is a schematic structural diagram of a first current amplification circuit in a current amplification circuitry formed on a pixel unit according to an embodiment of the present disclosure. The current amplification circuitry shown in FIG. 4 includes a plurality of first current amplification circuits 3, a voltage input terminal 4, a voltage control circuit 1, and a second current amplification circuit 2. The first current amplification circuit 3 includes a current mirror 31 and a photodiode 5. The current mirror 31 includes a first transistor T1 and a second transistor T2.

In the embodiment of the present disclosure, a coupling line a between the second electrode of the first transistor T1 of the current mirror 31 and the voltage control circuit 1 can be provided in the same layer as the first electrode and the second electrode A of the pixel unit by a patterning process. A coupling line b between the second electrode of the second transistor T2 and the voltage control circuit 1 can be provided in the same layer as the first electrode and the second electrode A of the pixel unit by a patterning process. A coupling line c between the second electrode of the second transistor T2 and the second current amplification circuit 2 can be provided in the same layer as the first electrode and the second electrode A of the pixel unit by a patterning process. The coupling line between the second electrode of the first transistor T1 and the first electrode of the second transistor T2 can be provided in the same layer as the control electrode B of the pixel unit by a patterning process. The coupling line between the control electrode of the first transistor T1 and the control electrode of the second transistor T2 can be provided in the same layer as the control electrode B of the pixel unit by a patterning process. The coupling line between the first electrode of the first transistor T1 and the control electrode of the second transistor T2 can be provided in the same layer as the control electrode B of the pixel unit by a patterning process. The coupling line between the output terminal of the photodiode 5 and the first electrode of the first transistor T1 can be provided in the same layer as the control electrode B of the pixel electrode by a patterning process. The input terminal of the photodiode 5 can be coupled to the voltage input terminal 4 through a common electrode C of the pixel unit, and the coupling line is covered with an active layer D of the pixel unit.

The structure shown in FIG. 4 further includes a plurality of via holes d, and the plurality of coupling lines may be coupled to the corresponding structural layers through the via holes d. The voltage input terminal 4 may be coupled to the common electrode C of the pixel unit through the corresponding via hole, and the voltage signal from the voltage input terminal 4 can be transmitted to the plurality of first current amplification circuits 3 through the common electrode C of the pixel units.

Embodiments of the present disclosure further provide a method for driving a current amplification circuitry, which is implemented by the current amplification circuitry to amplify a current.

Figure 5:
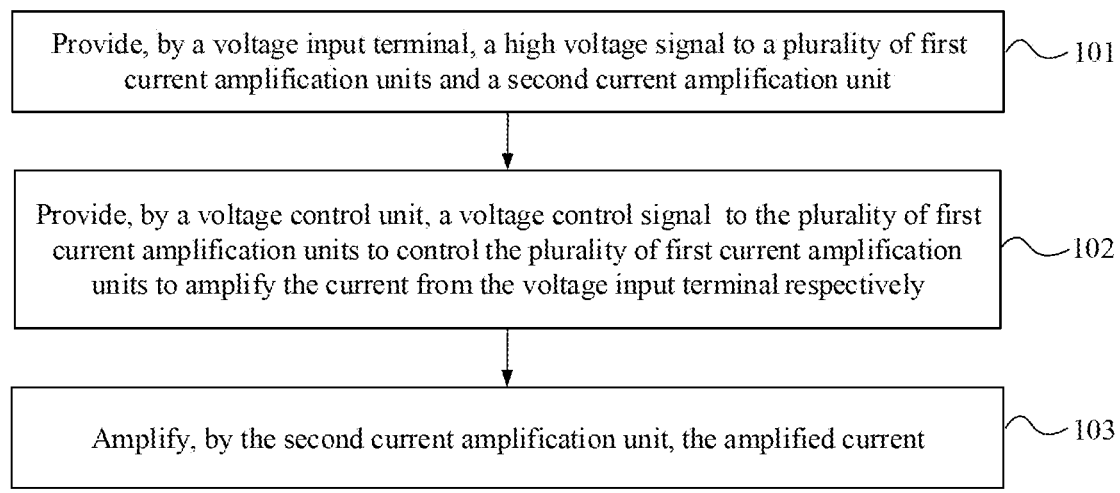
FIG. 5 is a schematic flow chart of a method for driving the current amplification circuitry according to an embodiment of the present disclosure.

FIG. 5 is a flow chart of a method for driving a current amplification circuitry according to an embodiment of the present disclosure.

In the method, at 101, a high level voltage signal is provided by the voltage input terminal to the plurality of first current amplification circuits and the second current amplification circuit.

Based on the above description of the structure of the current amplification circuitry according to the embodiment of the present disclosure, the number of the first current amplification circuits arranged in the array is more than one, and each of the first current amplification circuits includes a current mirror. When the current amplification circuitry operates, the current mirror is controlled according to the voltage signal from the voltage input terminal and the voltage control signal from the voltage control circuit. When there is a voltage difference across a current mirror, and the voltage difference satisfies a current mirror turn-on condition, the current mirror is turned on.

In embodiments of the present disclosure, a high level voltage signal can be provided to the first current amplification circuits by the voltage input terminal, such that the first electrodes of transistors of the current mirror in each of the first current amplification circuits are provided with a high level voltage.

At 102, a voltage control signal is provided to the plurality of first current amplification circuits by the voltage control circuit, to control the plurality of first current amplification circuits to amplify the current from the voltage input terminal respectively. Further, the amplified current can be provided to the second current amplification circuit.

At 103, the amplified current is amplified by the second current amplification circuit.

According to the driving method provided by the embodiment of the present disclosure, the control of the current amplification circuitry can be realized, and the amplification processing on the current from the voltage input terminal in each of the first current amplification circuits can be implemented.

In the embodiment of the present disclosure, the voltage control circuit is controlled to output a voltage control signal to the first current amplification circuits, to control the operation of the current mirror of each of the first current amplification circuits and perform the amplification processing on the current from the voltage input terminal by the current mirror of each of the first current amplification circuits.

The voltage control signal may control all the first current amplification circuits 3 to perform current amplification processing at the same time, may also control a part of the first current amplification circuits 3 to operate at the same time, and control the other part of the first current amplification circuits 3 to operate after the above part of the first current amplification circuits 3 finish operating, or alternatively, may control the first current amplification circuits 3 to operate in time sequence.

When the voltage control signal controls the first current amplification circuits 3 to operate in time sequence, the step of providing, by the voltage control circuit, a voltage control signal to the plurality of first current amplification circuits to control the plurality of first current amplification circuits to amplify the current from the voltage input terminal respectively, includes providing, by the voltage control circuit, voltage control signals in time sequence to the plurality of first current amplification circuits, such that a low level voltage signal is provided to one of the first current amplification circuits and a high level voltage signal is provided to the other first current amplification circuits at time T. Under the control of the above voltage control signals, the current mirror of one first current amplification circuit is turned on at a certain time, thereby realizing the sequential operation of the plurality of first current amplification circuits 3.

The first current amplification circuit may further include a photodiode, which is coupled between the voltage input terminal and the current mirror. The input terminal of the photodiode is coupled to the voltage input terminal. Therefore, the step of amplifying the current from the voltage input terminal by the first current amplification circuit may include amplifying the photocurrent provided from the photodiode by the first current amplification circuit, thereby achieving amplification of the small current provided from the photodiode.

In another aspect, embodiments of the present disclosure also provide a fingerprint detection device including the above-described current amplification circuit.

The embodiments of the present disclosure provide a current amplification circuitry, a fingerprint detection device, and a method for driving a current amplification circuitry. In the current amplification circuitry, as the current from the voltage input terminal is performed with a first stage of amplification processing by the current mirror, the current amplification factor required for the second current amplification circuit to perform second stage of amplification processing on the current can be effectively reduced. As the second current amplification circuit is generally integrated in an integrated circuit chip, the current amplification circuitry provided by the present disclosure may effectively reduce the resistance value of the resistor for amplifying the current in the second current amplification circuit on the integrated circuit chip. The resistor with small resistance can be easily integrated into the integrated circuit chip, which may satisfy high precision requirements.

According to the embodiments of the present disclosure, the first current amplification circuit further includes a photodiode coupled between the voltage input terminal and the current mirror. The input terminal of the photodiode is coupled to the voltage input terminal. The current mirror amplifies the photocurrent provided from the photodiode, and the second current amplification circuit amplifies the inflow current. The amplification requirements on the current from the photodiode can be satisfied by two stages of current amplifications.

According to embodiments of the present disclosure, in the current amplification circuitry, the voltage control circuit provides voltage control signals in time sequence to the plurality of first current amplification circuits. At time T, a low level voltage signal is provided to one of the first current amplification circuits, a high level voltage signal is provided to the other first current amplification circuits, and a high level voltage signal is provided from the voltage input terminal. Under the control of the voltage signals, the voltage control circuit controls the plurality of first current amplification circuits to operate in time sequence, and perform current amplification processing sequentially, to realize the control of the plurality of first current amplification circuits.

According to embodiments of the present disclosure, in the current amplification circuitry, the first current amplification circuits may be formed in the pixel units of the array substrate and correspond to the pixel units respectively. The coupling lines between devices in the first current amplification circuits may be provided in the same layer as the metal layers in the pixel units by a patterning process. Although the transistor structure is arranged in the pixel unit, as the number of lead wires in the pixel units is not increased, the structure of the pixel unit can be simplified while realizing the current amplification function.

The unit described herein may be implemented as a combination of a processor and a memory, where the processor executes instructions stored in the memory to implement the function of the corresponding unit. The unit described herein may also be implemented in a complete hardware implementation, including an application specific integrated circuit (ASIC), a field programmable gate array (FPGA), and the like.

Several embodiments of the present disclosure have been described in detail above, but the scope of protection of the present disclosure is not limited thereto. It will be apparent to those skilled in the art that various modifications, substitutions, and variants may be made to the embodiments of the present disclosure without departing from the spirit and scope of the disclosure. The scope of protection of the present disclosure is defined by the appended claims.

What is claimed is:

1. Current amplification circuitry comprising a voltage control circuit, a plurality of first current amplification circuits, and a second current amplification circuit,
   wherein the voltage control circuit is coupled to the plurality of first current amplification circuits and configured to provide a voltage control signal to the plurality of first current amplification circuits;
   wherein the first current amplification circuit comprises a current mirror, the current mirror coupled to a voltage input terminal, the voltage control circuit, and a first input terminal of the second current amplification circuit respectively, the first current amplification circuit configured to amplify a current from the voltage input terminal according to the voltage control signal provided by the voltage control circuit and provide the amplified current to the second current amplification circuit;
   wherein the second current amplification circuit is coupled to the voltage input terminal via a second input terminal and configured to amplify the amplified current; and
   wherein the voltage input terminal provides a high level voltage signal to the plurality of first current amplification circuits and the second current amplification circuit.

2. The current amplification circuitry according to claim 1, wherein the current mirror comprises:
   a first transistor, wherein a control electrode and a first electrode of the first transistor are coupled to the voltage input terminal, and wherein a second electrode of the first transistor is coupled to the voltage control circuit; and
   a second transistor, wherein a control electrode of the second transistor is coupled to the control electrode of the first transistor, wherein a first electrode of the second transistor is coupled to the second electrode of the first transistor, and wherein a second electrode of the second transistor is coupled to the first input terminal of the second current amplification circuit.

3. The current amplification circuitry according to claim 2, wherein an amplification factor of the current mirror for amplifying the current from the voltage input terminal is inversely proportional to a width to length ratio of the first transistor, and is proportional to a width to length ratio of the second transistor.

4. The current amplification circuitry according to claim 1, wherein the voltage control circuit provides voltage control signals in time sequence to the plurality of first current amplification circuits respectively, wherein at time T, a low level voltage signal is provided to one of the first current amplification circuits, and wherein a high level voltage signal is provided to the other first current amplification circuits.

5. The current amplification circuitry according to claim 1, wherein the first current amplification circuit further comprises a photodiode coupled between the voltage input terminal and the current mirror, and wherein the current mirror amplifies a photocurrent provided by the photodiode.

6. The current amplification circuitry according to claim 1, further comprising:
a feedback resistor, one end of the feedback resistor coupled to an output terminal of the second current amplification circuit, and the other end of the feedback resistor coupled to the first input terminal of the second current amplification circuit.

7. The current amplification circuitry according to claim 1, further comprising:
an analog to digital converter coupled to the output terminal of the second current amplification circuit.

8. The current amplification circuitry according to claim 1, wherein the voltage control circuit, the second current amplification circuit, and the voltage input terminal are integrated in an integrated circuit chip.

9. The current amplification circuitry according to claim 2, wherein the first current amplification circuits are formed in pixel units of an array substrate and correspond to the pixel units respectively.

10. The current amplification circuitry according to claim 9,
wherein a coupling line between the second electrode of the first transistor and the voltage control circuit is provided in the same layer as the first electrode and the second electrode of the pixel unit by a patterning process;
wherein a coupling line between the second electrode of the second transistor and the voltage control circuit is provided in the same layer as the first electrode and the second electrode of the pixel unit by a patterning process;
wherein a coupling line between the second electrode of the second transistor and the second current amplification circuit is provided in the same layer as the first electrode and the second electrode of the pixel unit by a patterning process;
wherein a coupling line between the second electrode of the first transistor and the first electrode of the second transistor is provided in the same layer as the control electrode of the pixel unit by a patterning process;
wherein a coupling line between the control electrode of the first transistor and the control electrode of the second transistor is provided in the same layer as the control electrode of the pixel unit by a patterning process;
wherein a coupling line between the first electrode of the first transistor and the control electrode of the second transistor is provided in the same layer as the control electrode of the pixel unit by a patterning process; and
wherein the current amplification circuitry further comprises a photodiode coupled between the voltage input terminal and the current mirror, wherein a coupling line between one end of the photodiode and the first electrode of the first transistor is provided in the same layer as the control electrode of the pixel electrode by a patterning process, and wherein the other end of the photodiode is coupled to the voltage input terminal through a common electrode of the pixel unit.

11. A method for driving the current amplification circuitry according to claim 1, the method comprising:
providing, by the voltage input terminal, the high level voltage signal to the plurality of first current amplification circuits and the second current amplification circuit;
providing, by the voltage control circuit, the voltage control signal to the plurality of first current amplification circuits to control the plurality of first current amplification circuits to amplify the current from the voltage input terminal respectively; and
amplifying, by the second current amplification circuit, the amplified current.

12. The method according to claim 11, wherein providing the voltage control signal comprises:
providing voltage control signals in time sequence to the plurality of first current amplification circuits, such that a low level voltage signal is provided to one of the first current amplification circuits and a high level voltage signal is provided to the other first current amplification circuits at time T.

13. The method according to claim 11, wherein the first current amplification circuit further comprises a photodiode coupled between the voltage input terminal and the current mirror, and wherein amplifying the current from the voltage input terminal by the first current amplification circuit comprises:
amplifying the photocurrent provided from the photodiode by the first current amplification circuit.

14. A fingerprint detection device comprising a current amplification circuitry according to claim 1.

* * * * *